(12) United States Patent
Zhang et al.

(10) Patent No.: US 12,356,833 B2
(45) Date of Patent: Jul. 8, 2025

(54) THREE-DIMENSIONAL DISPLAY ASSEMBLIES, DISPLAY PANELS THEREOF AND METHODS OF MANUFACTURING DISPLAY PANEL

(71) Applicant: BOE Technology Group Co., Ltd., Beijing (CN)

(72) Inventors: Lizhen Zhang, Beijing (CN); Sheng Xu, Beijing (CN); Wei He, Beijing (CN); Yi Zhou, Beijing (CN); Qi Yao, Beijing (CN); Huili Wu, Beijing (CN); Wusheng Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 551 days.

(21) Appl. No.: 17/912,372

(22) PCT Filed: May 7, 2021

(86) PCT No.: PCT/CN2021/092231
§ 371 (c)(1),
(2) Date: Sep. 16, 2022

(87) PCT Pub. No.: WO2022/183588
PCT Pub. Date: Sep. 9, 2022

(65) Prior Publication Data
US 2023/0147104 A1 May 11, 2023

(30) Foreign Application Priority Data
Mar. 1, 2021 (CN) .......................... 202110226614.1

(51) Int. Cl.
*G02B 30/27* (2020.01)
*H10K 59/12* (2023.01)
*H10K 59/80* (2023.01)

(52) U.S. Cl.
CPC ....... *H10K 59/80515* (2023.02); *G02B 30/27* (2020.01); *H10K 59/1201* (2023.02); *H10K 59/879* (2023.02)

(58) Field of Classification Search
CPC ........... H10K 59/80515; H10K 59/879; H10K 59/1201; G02B 30/27
(Continued)

(56) References Cited

U.S. PATENT DOCUMENTS

2017/0133636 A1 5/2017 Yoshida et al.
2020/0251678 A1 8/2020 Song et al.
(Continued)

FOREIGN PATENT DOCUMENTS

CN 104701339 A 6/2015
CN 110767721 A 2/2020
(Continued)

OTHER PUBLICATIONS

CN2021102266141 first office action.
PCT/CN2021/092231 international search report.
PCT/CN2021/092231 Written Opinion.

*Primary Examiner* — Christopher M Raabe
(74) *Attorney, Agent, or Firm* — IPro, PLLC (57) ABSTRACT

A 3D display assembly, a display panel thereof and a method of manufacturing display panel. The display panel includes: a back plate, and a plurality of sub-pixel structures and partition structures on the back plate. In a first direction, each of the sub-pixel structures includes one or more first sub-sub-pixel structures and one or more second sub-sub-pixel structures arranged alternately. The first sub-sub-pixel structures have the same luminous color as the one or more second sub-sub-pixel structures. Each of the first sub-sub-pixel structures includes a first anode, and each of the second sub-sub-pixel structures includes a second anode. Second anodes are disposed at a side of the partition structures away (Continued)

from the back plate. Adjacent first anodes are partitioned by a partition structure. Orthographic projections of the first anodes on the back plate and orthographic projections of the second anodes on the back plate are connected, or the orthographic projections of the first anodes on the back plate and the orthographic projections of the second anodes on the back plate are overlapped and there is no non-light emitting region between sub-sub-pixel structures, therefore, no dark region is formed in a human eye observation region during 3D display, thereby solving moire problem.

20 Claims, 7 Drawing Sheets

(58) Field of Classification Search
USPC .......................................................... 313/500
See application file for complete search history.

(56) References Cited

U.S. PATENT DOCUMENTS

| | | |
|---|---|---|
| 2021/0157164 A1 | 5/2021 | Li et al. |
| 2021/0158740 A1 | 5/2021 | Yang et al. |
| 2021/0193763 A1 | 6/2021 | Sun et al. |
| 2021/0335940 A1 | 10/2021 | Liang et al. |
| 2021/0408203 A1* | 12/2021 | Shi .................. H10D 86/60 |
| 2022/0059631 A1* | 2/2022 | Zhang ............... H10K 59/124 |
| 2022/0394236 A1 | 12/2022 | Gao |

FOREIGN PATENT DOCUMENTS

| | | |
|---|---|---|
| CN | 110824725 A | 2/2020 |
| CN | 110828527 A | 2/2020 |
| CN | 111552093 A | 8/2020 |
| IN | 108831914 A | 11/2018 |
| IN | 111223904 A | 6/2020 |

* cited by examiner

THREE-DIMENSIONAL DISPLAY ASSEMBLIES, DISPLAY PANELS THEREOF AND METHODS OF MANUFACTURING DISPLAY PANEL

CROSS-REFERENCE TO RELATED APPLICATIONS

The present disclosure is a US national phase of PCT application No. PCT/CN2021/092231 filed on May 7, 2021, which claims the priority of the Chinese Patent Application No. CN202110226614.1, filed on Mar. 1, 2021, the entire contents of which are incorporated herein by reference.

TECHNICAL FIELD

The present disclosure relates to the field of display device technologies, and in particular to a three-dimensional (3D) display assembly, a display panel thereof and a method of manufacturing a display panel.

BACKGROUND

In recent years, stereoscopic display, i.e. three-dimensional (3D) display has become a major trend in the display field. Compared with common two-dimensional display, 3D technology may enable pictures to become stereoscopic and vivid, and images are no longer limited to screen planes, and are presented as if they can go out of the screen, so that the audience can have an immersive feeling.

However, when sub-pixels of display panels in the related arts do not emit light continuously, an eye observation region may see a phenomenon of bright regions and dark regions, and all dark regions are connected together to form 3D moire fringe (mura). Therefore, it is difficult for those skilled in the art to improve 3D display effect and achieve moire-free display.

SUMMARY

The present disclosure provides a 3D display assembly, a display panel thereof and a method of manufacturing a display panel so as to solve the shortcomings in the related arts.

In order to achieve the above purposes, a first aspect of embodiments of the present disclosure provides a display panel, including a back plate, a plurality of sub-pixel structures and a plurality of partition structures located on the back plate, where in a first direction, each of the sub-pixel structures comprises one or more first sub-sub-pixel structures and one or more second sub-sub-pixel structures arranged alternately, the one or more first sub-sub-pixel structures have a same luminous color as the one or more second sub-sub-pixel structures, each of the first sub-sub-pixel structures comprises a first anode, each of the second sub-sub-pixel structures comprises a second anode, second anodes are disposed at a side of the partition structures away from the back plate, adjacent first anodes are partitioned by a partition structure, orthographic projections of the first anodes on the back plate and orthographic projections of the second anodes on the back plate are mutually connected, or the orthographic projections of the first anodes on the back plate and the orthographic projections of the second anodes on the back plate overlap each other.

Optionally, the partition structures are T-shaped, each of the T-shaped partition structures comprises a support portion and a partition portion, the second anodes are located at the side of the partition portions away from the back plate, and the first anodes are located at both sides of respective support portions.

Optionally, a height of each of the support portions is greater than a height of each of the first anodes.

Optionally, the partition portions each comprises one or more suspended segments; in the first direction, a size of each of the partition portions is in a range of 40 μm-50 μm, and/or, a size of each of the suspended segments is in a range of 1 μm-2 μm.

Optionally, the first direction is a column direction, and each of the sub-pixel structures comprises at least one column of first sub-sub-pixel structures and second sub-sub-pixel structures arranged alternately; or, the first direction is a row direction, and each of the sub-pixel structures comprises at least one row of first sub-sub-pixel structures and second sub-sub-pixel structures arranged alternately.

Optionally, the first direction is the column direction, and each of the sub-pixel structures comprises at least two columns of first sub-sub-pixel structures and second sub-sub-pixel structures arranged alternately.

Optionally, each of the sub-pixel structures comprises at least two rows of first sub-sub-pixel structures and at least one row of second sub-sub-pixel structures that are alternately arranged and in at least two columns; there is a gap present between adjacent first sub-sub-pixel structures in a same row and between adjacent second sub-sub-pixel structures in a same row.

Optionally, the first direction is the row direction, and each of the sub-pixel structures comprises at least two rows of first sub-sub-pixel structures and second sub-sub-pixel structures arranged alternately.

Optionally, each of the sub-pixel structures comprises at least two columns of first sub-sub-pixel structures and at least one column of second sub-sub-pixel structures that are alternately arranged and in at least two rows; there is a gap present between adjacent first sub-sub-pixel structures in a same column and between adjacent second sub-sub-pixel structures in a same column.

Optionally, in the first direction, each of the second anodes has a same width as each of the first anodes.

Optionally, a second direction is perpendicular to the first direction; in the second direction, a length of each of the second anodes is in a range of 40 μm-50 μm, and in the first direction, a width of each of the second anodes is in a range of 10 μm-20 μm; and/or, in the second direction, a length of each of the first anodes is in a range of 40 μm-50 μm, and in the first direction, a width of each of the first anodes is in a range of 10 μm-20 μm.

Optionally, in the first direction, each of the first anodes is connected with respective pixel driving circuits to provide different view information of one object; one second anode and an adjacent first anode are connected with a same pixel driving circuit to provide same view information of one object; or, one second anode and an adjacent first anode are connected with different pixel driving circuits to provide different view information of one object.

Optionally, the back plate has a pixel definition layer, the pixel definition layer has a plurality of openings and one of the openings has one of the sub-pixel structures.

Optionally, a distance between first sub-sub-pixel structures in a same sub-pixel structure is smaller than a distance between first sub-sub-pixel structures in different sub-pixel structures.

Optionally, each of the first sub-sub-pixel structures comprises a first cathode and each of the second sub-sub-pixel structures comprises a second cathode;

in the first direction, the first cathodes and the second cathodes are connected together; or, in the first direction, the first cathodes and the second cathodes are partitioned, and in a second direction, the first cathodes and the second cathodes are connected together, and the second direction is perpendicular to the first direction.

A second aspect of embodiments of the present disclosure provides a method of manufacturing a display panel. The method includes:

providing a back plate, wherein the back plate comprises a plurality of sub-pixel structure regions arranged alternately and a non-pixel structure region; in a first direction, each of the sub-pixel structure regions comprises one or more first sub-sub-pixel structure regions and one or more second sub-sub-pixel structure regions arranged alternately;

forming one or more partition structures in the one or more second sub-sub-pixel structure regions;

forming one or more first sub-sub-pixel structures in the one or more first sub-sub-pixel structure regions, and forming one or more second sub-sub-pixel structures at a side of the partition structures away from the back plate, wherein the first sub-sub-pixel structures have a same luminous color as the second sub-sub-pixel structures, each of the first sub-sub-pixel structures comprises a first anode, and each of the second sub-sub-pixel structures comprises a second anode; first anodes and second anodes are formed in a same procedure, the second anodes are located at the side of the partition structures away from the back plate, adjacent first anodes are partitioned by a partition structure, orthographic projections of the first anodes on the back plate and orthographic projections of the second anodes on the back plate are mutually connected, or the orthographic projections of the first anodes on the back plate and the orthographic projections of the second anodes on the back plate overlap each other.

Optionally, forming the one or more first sub-sub-pixel structures on the first sub-sub-pixel structure regions and forming the one or more second sub-sub-pixel structures at the side of the partition structures away from the back plate includes:

depositing an anode material layer, wherein the anode material layer is partitioned by the partition structures, the anode material layer at both sides of the partition structures forms the first anodes, and the anode material layer on the partition structures forms the second anodes;

forming a pixel definition layer on the first anodes, the second anodes and the non-pixel structure region; forming openings in the pixel definition layer, wherein the openings expose the first anodes and the second anodes; forming one or more first light-emitting blocks and one or more second light-emitting blocks correspondingly in each of the openings; evaporating a cathode material layer, wherein the cathode material layer on the first light-emitting blocks forms first cathodes and the cathode material layer on the second light-emitting blocks forms second cathodes.

Optionally, the back plate comprises a substrate and a planarization layer covering the substrate, pixel driving circuits arranged in an array are provided between the substrate and the planarization layer, and each of the pixel driving circuits comprises one or more transistors; before the anode material layer is deposited, a plurality of first vias and a plurality of second vias are formed in the planarization layer, the first vias expose source electrodes or drain electrodes of transistors to be connected with the first anodes, and the second vias expose source electrodes or drain electrodes of transistors to be connected with the second anodes; the first anodes fill the first vias when the anode material layer is deposited, lapping electrodes are also formed when the anode material layer is deposited, the lapping electrodes fill the second vias, and the lapping electrodes and the second anodes are overlapped.

Optionally, forming the one or more partition structures includes:

forming a first material layer, a second material layer and a mask layer sequentially on the back plate across an entire surface; patterning the mask layer to form openings which expose the first sub-sub-pixel structure regions and the non-pixel structure region;

with the patterned mask layer as a mask, etching the second material layer and the first material layer, wherein an etching rate of the first material layer is greater than an etching rate of the second material layer, and the second material layer and the first material layer retained in the second sub-sub-pixel structure regions form the partition structures.

Optionally, before the first material layer is formed, first transparent electrodes and second transparent electrodes are formed on the back plate, the first transparent electrodes are connected with the first anodes, and the second transparent electrodes are connected with the second anodes; the first transparent electrodes and the second transparent electrodes are etch stop layers during etching of the second material layer and the first material layer.

A third aspect of embodiments of the present disclosure provides a 3D display assembly, including:

the display panel according to any one of the above items;

a cylindrical lens array disposed at a light-emitting side of the display panel, wherein the plurality of sub-pixel structures are located on a focal plane of the cylindrical lens array; the cylindrical lens array comprises a plurality of cylindrical lenses, and the cylindrical lenses extend in a direction perpendicular to the first direction.

Optionally, one group of sub-pixel structures having different luminous colors form a pixel structure unit, each cylindrical lens of the cylindrical lens array extends along a column direction, one cylindrical lens corresponds to one column of pixel structure units, and each of the sub-pixel structures comprises several columns of first sub-sub-pixel structures and several columns of second sub-sub-pixel structures; or, each cylindrical lens of the cylindrical lens array extends along a row direction, one cylindrical lens corresponds to one row of pixel structure units, and each of the sub-pixel structures comprises several rows of first sub-sub-pixel structures and several rows of second sub-sub-pixel structures.

Figure 1:
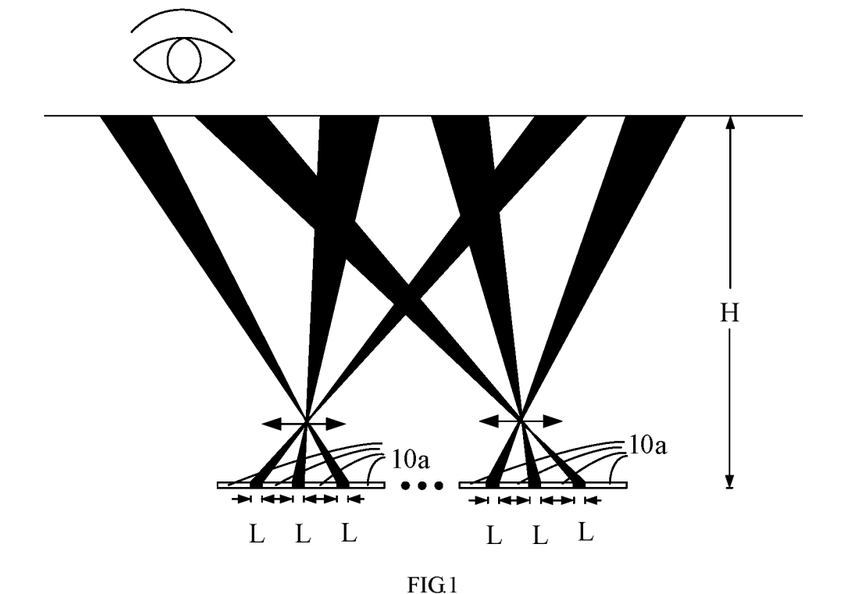
FIG. 1 is a diagram illustrating principle of generation of moire by a 3D display assembly in the related arts.

FIG. 1 is a diagram illustrating a principle of generation of moire by a 3D display assembly in the related arts. For the problem of moire in the related arts, the inventors perform analysis and find the following causes: with reference to FIG. 1, due to diffraction in lithography and limitations in the etching processes, when an anode material layer is etched to form anodes 10a, a spacing L of at least 3.5 μm is present between adjacent anodes 10a and no light can be emitted in the spacings L. A distance between human eyes and the 3D display assembly is H, and the distance H can increase a size of the non-light emitting regions, so as to form dark regions in an eye observation region, i.e. moire. Based on the above analysis, in the embodiments of the present disclosure, first anodes and second anodes with little gap therebetween are formed by a partition structure. The first anodes correspond to first sub-sub-pixel structures, the second anodes correspond to second sub-sub-pixel structures, and there is no non-light emitting region between the sub-sub-pixel structures. Therefore, no dark region is formed in the eye observation region, thereby solving the moire problem.

It should be understood that the above general descriptions and subsequent detailed descriptions are merely illustrative and explanatory rather than limiting of the present disclosure.

BRIEF DESCRIPTION OF THE DRAWINGS

The accompanying drawings, which are incorporated in and constitute a part of the present description, illustrate examples consistent with the present disclosure and serve to explain the principles of the present disclosure together with the description.

Numerals of drawings are described below:

| | |
|---|---|
| display panel 11-1, 11-2, 11-3, 11-4, 11-5 | back plate 10 |
| pixel structure unit 111 | sub-pixel structure 112 |
| first sub-sub-pixel structure 1121 | first anode 1121a |
| first cathode 1121b | first light emitting block 1121c |
| second sub-sub-pixel structure 1122 | second anode 1122a |
| second cathode 1122b | second light emitting block 1122c |
| partition structure 113 | support portion 113a |
| partition portion 113b | substrate 110 |
| gate electrode 114 | gate insulation layer 115 |

-continued

| | |
|---|---|
| active layer 116 | source electrode 117a |
| drain electrode 117b | inter-layer dielectric layer ILD |
| passivation layer PVX | planarization layer PLN |
| transistor T | pixel definition layer PDL |
| sub-pixel structure region 101 | non-pixel structure region 102 |
| first sub-sub-pixel structure region 101a | second sub-sub-pixel structure region 101b |
| first material layer 1131 | second material layer 1132 |
| mask layer 30 | opening 30a |
| first via 118a | second via 118b |
| lapping electrode 119 | first transparent electrode 1121d |
| 3D display assembly 1, 2 | cylindrical lens array 12 |
| cylindrical lens 121 | size of partition structure L1 |
| size of suspended segment L2 | anode 10a |

DETAILED DESCRIPTION OF THE EMBODIMENTS

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

Figure 2:
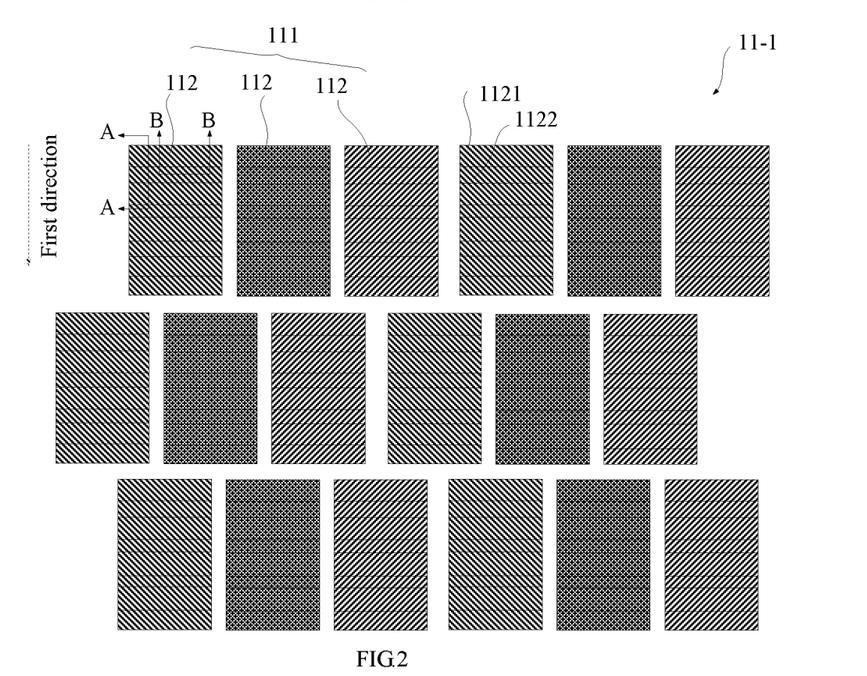
FIG. 2 is a top view illustrating a display panel according to a first embodiment of the present disclosure.
Figure 3:
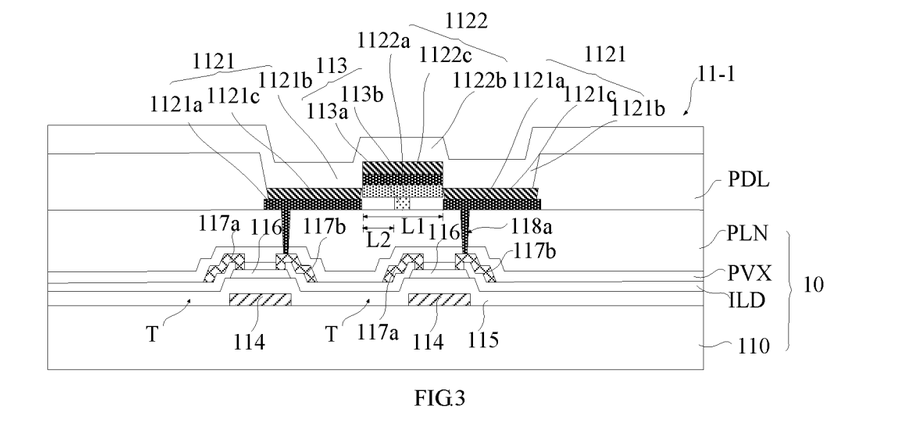
FIG. 3 is a sectional view taken along AA line in FIG. 2.

FIG. 2 is a top view of a display panel according to a first embodiment of the present disclosure. FIG. 3 is a sectional view taken along AA line in FIG. 2.

As shown in FIGS. 2 and 3, a display panel 11-1 includes: a back plate 10, and a plurality of sub-pixel structures 112 and a plurality of partition structures 113 located on the back plate 10, where, in a first direction, the sub-pixel structure 112 includes first sub-sub-pixel structures 1121 and second sub-sub-pixel structures 1122 that are arranged alternately, the first sub-sub-pixel structures 1121 have the same luminous color as the second sub-sub-pixel structures 1122, the first sub-sub-pixel structure 1121 includes a first anode 1121a, the second sub-sub-pixel structure 1122 includes a second anode 1122a, the second anodes 1122a are disposed at a side of the partition structures 113 away from the back plate 10, the adjacent first anodes 1121a are partitioned by a partition structure 113, orthographic projections of the first anodes 1121a on the back plate 10 and orthographic projections of the second anodes 1122a on the back plate 10 are mutually connected, or the orthographic projections of the first anodes 1121a on the back plate 10 and the orthographic projections of the second anodes 1122a on the back plate 10 overlap each other.

As shown in FIG. 3, the back plate 10 includes a substrate 110. The substrate 110 may be a flexible substrate or a hard substrate. A material of the flexible substrate may be polyimide and a material of the hard substrate may be glass.

A buffer layer, a water vapor isolation layer, etc., may be disposed on polyimide or glass.

As shown in FIGS. 2 and 3, a plurality of sub-pixel structures 112 having different luminous colors are arranged alternately. One group of sub-pixel structures having different luminous colors forms one pixel structure unit 111. A plurality of pixel structure units 111 are arranged in an array.

In this embodiment, each sub-pixel structure 112 includes one column and several rows of first sub-sub-pixel structures 1121 and one column and several rows of second sub-sub-pixel structures 1122. The first sub-sub-pixel structures 1121 are arranged into at least two rows and the second sub-sub-pixel structures 1122 are arranged into at least one row. The first sub-sub-pixel structures 1121 have the same luminous color as the second sub-sub-pixel structures 1122. Each first sub-sub-pixel structure 1121 includes: a first anode 1121a, a first cathode 1121b and a first light emitting block 1121c disposed between the first anode 1121a and the first cathode 1121b. Each second sub-sub-pixel structure 1122 includes a second anode 1122a, a second cathode 1122b and a second light emitting block 1122c disposed between the second anode 1122a and the second cathode 1122b. A material of the first light emitting block 1121c and the second light emitting block 1122c may be OLED. The first light emitting block 1121c and the second light emitting block 1122c may be red, green or blue, and may alternatively be red, green, blue or yellow. In this embodiment, the first cathode 1121b of each first sub-sub-pixel structure 1121 and the second cathode 1122b of each second sub-sub-pixel structure 1122 are connected together to form a planar electrode.

Regions of all first light-emitting blocks 1121c and all second light-emitting blocks 1122c of one sub-pixel structure 112 may be defined by one opening of a pixel definition layer PDL.

A distance between adjacent first sub-sub-pixel structures 1121 in one sub-pixel structure 112 is smaller than a distance between the first sub-sub-pixel structures 1121 of different sub-pixel structures 112.

In this embodiment, pixel driving circuits arranged in an array are disposed between the pixel structure units 111 and the substrate 110, and the pixel driving circuits each includes a plurality of transistors T. As shown in FIG. 3, the first anode 1121a is in electrical communication with a drain electrode 117b of a transistor T. Furthermore, the second anode 1122a may also be in electrical connection with a drain electrode 117b of a transistor T. In other words, the first sub-sub-pixel structure 1121 and the second sub-sub-pixel structure 1122 both are Active Matrix OLEDs (AMOLED).

The Active Matrix OLED, as known as active OLED, controls each pixel to emit light by use of a transistor array and each pixel can emit light continuously.

The transistor T may include a gate electrode 114, a gate insulation layer 115, an active layer 116, a source electrode 117a and a drain electrode 117b.

In this embodiment, the gate electrode 114 is close to the substrate 110 and the active layer 116 is away from the substrate 110 and therefore the transistor T is of a bottom gate structure. An inter-layer dielectric layer ILD is disposed at a side of the active layer 116 away from the substrate 110. The source electrode 117a and the drain electrode 117b are disposed at a side of the inter-layer dielectric layer ILD away from the substrate 110. The source electrode 117a may be connected with a source region of the active layer 116 by filling a via penetrating through the inter-layer dielectric layer ILD, and the drain electrode 117b may be connected with a drain region of the active layer 116 by filling a via penetrating through the inter-layer dielectric layer ILD. A part of the active layer 116 between the source region and the drain region is a channel region.

In other embodiments, the transistor T may alternatively be of a top gate structure. In the embodiments of the present disclosure, the specific structure of the pixel driving circuit is not limited.

With continuous reference to FIG. 3, a passivation layer PVX may be disposed at sides of the source electrode 117a, the drain electrode 117b and a part of the inter-layer dielectric layer ILD without the source electrode 117a and the drain electrode 117b thereon, which are away from the substrate 110. A planarization layer PLN is disposed at a side of the passivation layer PVX away from the substrate 110.

A plurality of partition structures 113 are disposed at a side of the planarization layer PLN away from the substrate 110. In this embodiment, the partition structure 113 is T-shaped, and the T-shaped partition structure 113 includes a support portion 113a and a partition portion 113b. The second anode 1122a is located at a side of the partition portion 113b away from the substrate 110, and the first anodes 1121a are located at both sides of the support portion 113a.

A height of the support portion 113a is greater than a thickness of the first anodes 1121a.

In the first direction, a size L1 of the partition portion 113b is in a range of 40 μm-50 μm.

The partition portion 113b includes one or more suspended segments, and in the first direction, a size L2 of the suspended segment is in a range of 1 μm-2 μm to effectively partition the first anode 1121a and the second anode 1122a.

In this embodiment, the orthographic projections of the first anodes 1121a on the back plate 10 and the orthographic projections of the second anodes 1122a on the back plate 10 being mutually connected includes the case that an extremely small gap is present between the orthographic projections of the first anodes 1121a on the back plate 10 and the orthographic projections of the second anodes 1122a on the back plate 10 due to evaporation of an anode material layer and manufacturing process of the partition structures 113.

In other embodiments, the partition structure 113 may alternatively be an inverse trapezoid.

Figure 4:
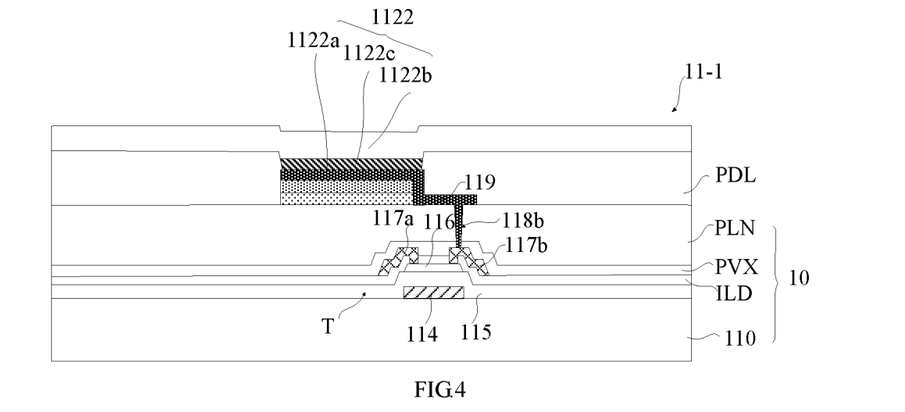
FIG. 4 is a sectional view taken along BB line in FIG. 2.
Figure 5:
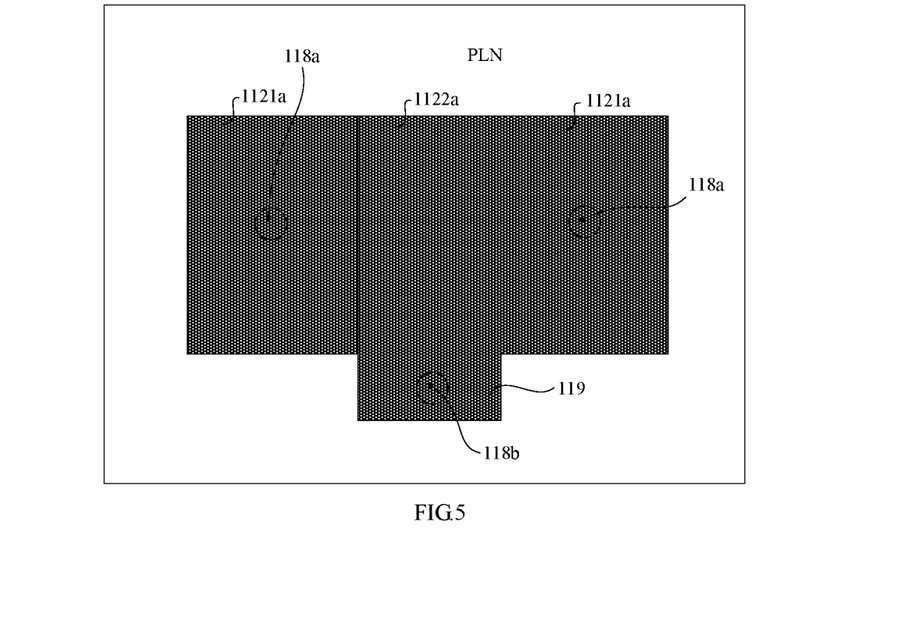
FIG. 5 is a top view of a display panel in FIG. 3 with cathodes, a pixel definition layer, first light emitting blocks and a second light emitting block removed.

FIG. 4 is a sectional view taken along BB line in FIG. 2. FIG. 5 is a top view of a display panel in FIG. 3 with cathodes, a pixel definition layer, first light emitting blocks and second light emitting blocks removed. As shown in FIGS. 3, 4 and 5, in this embodiment, the first anode 1121a is connected with the drain electrode 117b of the transistor T by filling a first via 118a penetrating through the planarization layer PLN and the passivation layer PVX, and the second anode 1122a is connected with a lapping electrode 119 which is connected with the drain electrode 117b of the transistor T by filling a second via 118b penetrating through the planarization layer PLN and the passivation layer PVX. In other embodiments, the first anode 1121a may alternatively be connected with the lapping electrode 119 which is connected with the drain electrode 117b of the transistor T by filling the first via 118a penetrating through the planarization layer PLN and the passivation layer PVX, or, the second anode 1122a is connected with the drain electrode 117b of the transistor T by filling the second via 118b penetrating through the partition structure 113, the planarization layer PLN and the passivation layer PVX.

In other embodiments, the first anode 1121a and the second anode 1122a may alternatively be connected with respective source electrodes 117a of the transistors T.

Figure 6:
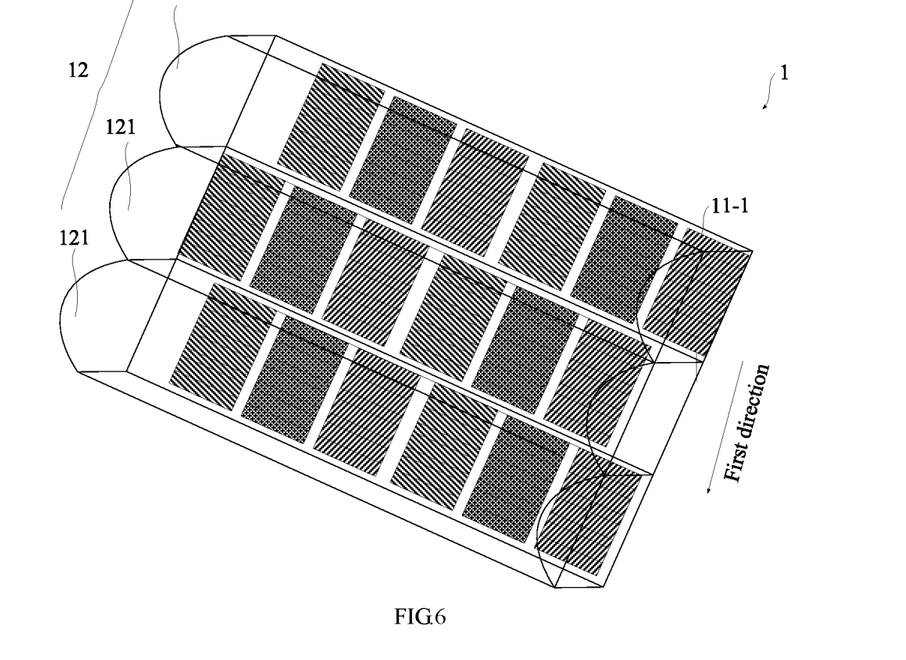
FIG. 6 is a perspective schematic diagram illustrating a 3D display assembly according to a first embodiment of the present disclosure.

A first embodiment of the present disclosure further provides a 3D display assembly. FIG. 6 is a perspective schematic diagram illustrating a 3D display assembly. As shown in FIG. 6, the 3D display assembly 1 includes:
  the display panel 11-1 as mentioned above;
  a cylindrical lens array 12 disposed at a light-emitting side of the display panel 11-1, where the plurality of sub-pixel structures 112 are located on a focal plane of the cylindrical lens array 12; the cylindrical lens array 12 includes a plurality of cylindrical lenses 121, and the cylindrical lenses 121 each extend in a direction perpendicular to the first direction.

In this embodiment, as shown in FIG. 6, each cylindrical lens 121 in the cylindrical lens array 12 extends along a row direction, and one cylindrical lens 121 corresponds to one row of pixel structure units 111. Each sub-pixel structure 112 includes one column and several rows of first sub-sub-pixel structures 1121 and one column and several rows of second sub-sub-pixel structures 1122.

In other embodiments, each cylindrical lens 121 in the cylindrical lens array 12 may alternatively extend along a column direction, and one cylindrical lens 121 corresponds to one column of pixel structure units 111. Each sub-pixel structure 112 includes one row and several columns of first sub-sub-pixel structures 1121 and one row and several columns of second sub-sub-pixel structures 1122.

In other embodiments, except for the cylindrical lens array 12, other light splitting elements for achieving 3D display may be adopted.

In this embodiment, first anodes 1121a in a same column are connected with respective pixel driving circuits to provide different view information of one object. One second anode 1122a and an adjacent first anode 1121a may be connected with a same pixel driving circuit such that the second anode 1122a and the first anode 1121a connected with the same pixel driving circuit can provide same view information of one object. In other words, for each of the first sub-sub-pixel structures 1121 in a same column, the first sub-sub-pixel structure and the adjacent second sub-sub-pixel structure 1122 in the column are driven simultaneously to emit light.

Figure 7:
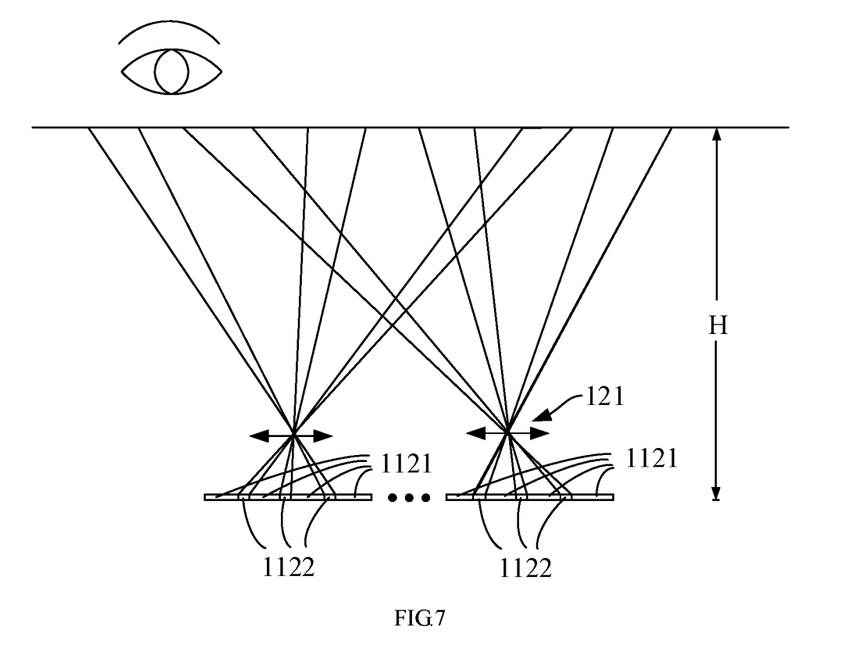
FIG. 7 is a diagram illustrating principle of display of a 3D display assembly according to a first embodiment of the present disclosure.

FIG. 7 illustrates principle of display of a 3D display assembly according to an embodiment. As shown in FIGS. 6 and 7, since the first sub-sub-pixel structures 1121 and the second sub-sub-pixel structures 1122 are located on the focal plane of the cylindrical lenses 121, light from two adjacent rows of first sub-sub-pixel structures 1121 in a same column splits, through refraction of the cylindrical lens 121, into upper and lower light beams which reach left eye and right eye of a person respectively. Two adjacent rows of first sub-sub-pixel structures 1121 in a same column respectively carry different view information of one object which is synthesized into a stereoscopic image of the object through brain. Since the second sub-sub-pixel structures 1122 between two adjacent rows of first sub-sub-pixel structures 1121 in a same column also emit light, there is no non-light emitting region between adjacent first sub-sub-pixel structures 1121. Even after the enlargement by the distance H between the human eyes and the 3D display assembly 1, no dark region can be formed in the human eye observation region, thereby solving the moire problem.

In other embodiments, one second anode 1122a and an adjacent first anode 1121a in a same column may be connected with different pixel driving circuits to provide different view information of one object. In other words, the first sub-sub-pixel structures 1121 and the second sub-sub-pixel structures 1122 in a same column are driven independently to emit light. One row of first sub-sub-pixel structures 1121 and one row of second sub-sub-pixel structures 1122 which are adjacent and in a same column may respectively carry different view information of one object which reaches human eyes and then is synthesized into a stereoscopic image of the object through brain. This embodiment not only solves the moire problem but also increases a number of positions of best human eye observation points, thereby improving the stereoscopic feel of the same object.

In some embodiments, a side of a cathode planar electrode away from the substrate 110 may be fully covered with an encapsulation layer. The encapsulation layer may be a thin film encapsulation layer including an overlapping structure of several organic, inorganic and organic layers. The cylindrical lens array 12 is disposed at a side of the encapsulation layer away from the substrate 110.

Figure 8:
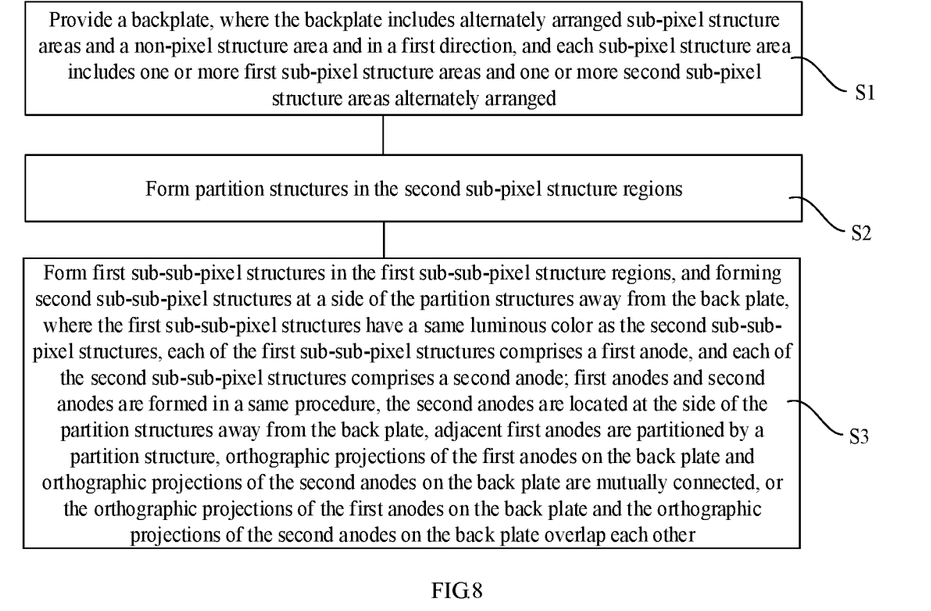
FIG. 8 is a flowchart illustrating a method of manufacturing a display panel according to a first embodiment of the present disclosure.

For the display panel 11-1 in FIGS. 2-5, the first embodiment of the present disclosure further provides a manufacturing method. FIG. 8 is a flowchart illustrating a manufacturing method. FIGS. 9-12 are schematic diagrams illustrating intermediate structures corresponding to the flow of FIG. 8.

Figure 9:
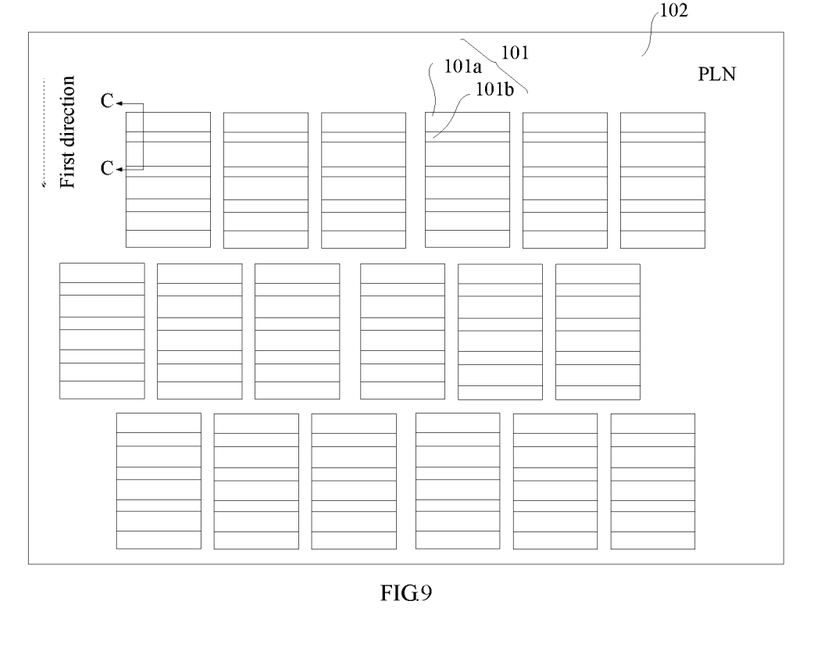
FIGS. 9-12 are schematic diagrams illustrating intermediate structures corresponding to the flow of FIG. 8.
Figure 10:
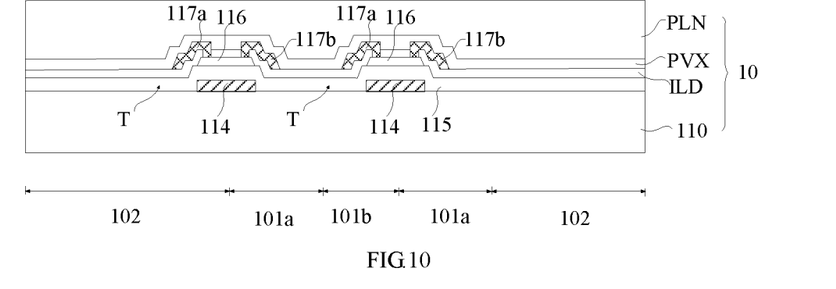

Firstly, referring to step S1 in FIG. 8, as shown in FIGS. 9 and 10 where FIG. 10 is a sectional view taken along CC line in FIG. 9, a back plate 10 is provided, where the back plate 10 includes a plurality of sub-pixel structure regions 101 arranged alternately and a non-pixel structure region 102; in a first direction, the sub-pixel structure region 101 includes first sub-sub-pixel structure regions 101a and second sub-sub-pixel structure regions 101b arranged alternately.

In this embodiment, the back plate 10 includes a substrate 110 and a planarization layer PLN covered on the substrate 110.

The substrate 110 may be a flexible substrate or a hard substrate. A material of the flexible substrate may be polyimide and a material of the hard substrate may be glass.

A buffer layer, a water vapor isolation layer, etc., may be disposed on polyimide or glass.

In this embodiment, pixel driving circuits arranged in an array are formed firstly on the substrate 110. Step S1 may specifically include steps S11-S17.

At step S11, a gate material layer is formed on an entire surface of the substrate 110; and the gate material layer is patterned to form a plurality of gate electrodes 114.

At step S12, a gate insulation layer 115 is formed on entire surfaces of the gate electrodes 114 and part of the substrate 110 not covered with the gate electrodes 114.

At step S13, an active material layer is formed on an entire surface of the gate insulation layer 115; and the active material layer is patterned to form active layers 116.

At step S14, an inter-layer dielectric layer ILD is formed on entire surfaces of the active layers 116 and part of the gate insulation layer 115 not covered with the active layers 116.

At step S15, vias are formed in the inter-layer dielectric layer ILD to expose source regions and drain regions of the active layers 116 respectively; the vias are filled and source electrodes 117a and drain electrodes 117b are formed on the inter-layer dielectric layer ILD.

At step S16, a passivation layer PVX is formed on entire surfaces of the source electrodes 117a, the drain electrodes 117b and part of the inter-layer dielectric layer ILD not covered with source electrodes 117a and drain electrodes 117b.

At step S17, a planarization layer PLN is formed on an entire surface of the passivation layer PVX.

The gate electrodes 114, the gate insulation layer 115, the active layers 116, the source electrodes 117a and the drain electrodes 117b form transistors T. In other embodiments, the transistors T may alternatively be of a top gate structure. In the embodiments of the present disclosure, the specific structure of the pixel driving circuit is not limited.

Figure 12:
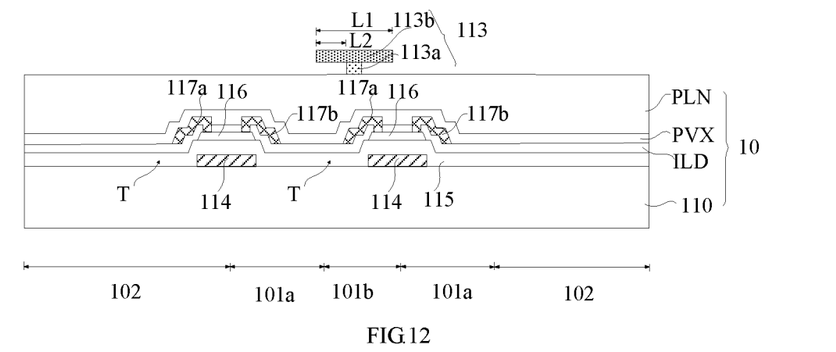

Next, by referring to step S2 in FIG. 8, as shown in FIG. 12, partition structures 113 are formed in the second sub-sub-pixel structure regions 101b.

In this embodiment, the step S2 may specifically include steps S21-S23.

Figure 11:
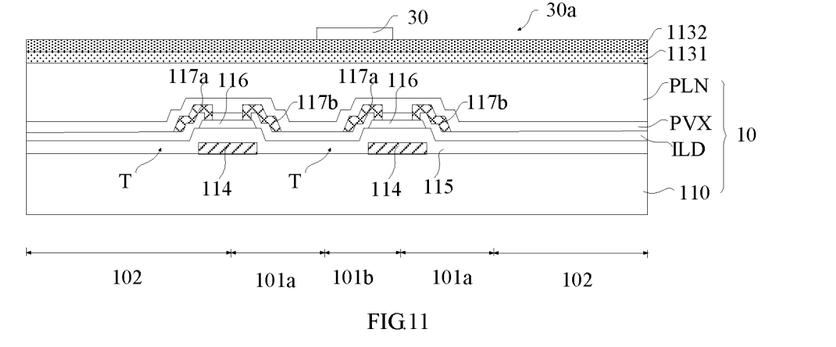

At step S21, as shown in FIG. 11, a first material layer 1131, a second material layer 1132 and a mask layer 30 are formed sequentially on an entire surface of the planarization layer PLN; the mask layer 30 is patterned to form openings 30a which expose the first sub-sub-pixel structure regions 101a and the non-pixel structure region 102.

The first material layer 1131 and the second material layer 1132 both may be made of inorganic material, for example, the material of the first material layer 1131 is silicon dioxide, the material of the second material layer 1132 is silicon nitride and the material of the mask layer 30 may be photoresist.

At step S22, with the patterned mask layer 30 as a mask, the second material layer 1132 and the first material layer 1131 are etched, where an etching rate of the first material layer 1131 is greater than an etching rate of the second material layer 1132, and the second material layer 1132 and the first material layer 1131 retained in the second sub-sub-pixel structure regions 101b form the partition structures 113.

The second material layer 1132 and the first material layer 1131 may be etched by dry etch or wet etch. By adjusting gas types and blending ratio of the dry etch or etching agent types and blending ratio of the wet etch, the etch selectivity of the dry etch gas or the wet etching agent for the first material layer 1131 is made greater than that for the second material layer 1132.

In some embodiments, the first material layer 1131 and the second material layer 1132 both may be made of organic material, and based on exposure intensity and photosensitivity type of the first material layer 1131 and the second material layer 1132, a removal amount of the first material layer 1131 is made greater than a removal amount of the second material layer 1132.

In pattern design, a thickness of the first material layer 1131 may be greater than a thickness of an anode material layer to ensure the first anodes 1121a and the second anodes 1122a formed by partitioning the anode material layer are disconnected. In some examples, the thickness of the first material layer 1131 may be greater than a sum of thicknesses of the anode material layer and the first light emitting block 1121c.

In a first direction, a size L1 of the partition portion 113b is in a range of 40 μm-50 μm.

The partition portion 113b includes one or more suspended segments. In the first direction, a size L2 of the suspended segment is in a range of 1 μm-2 μm, which may not only effectively partition the first anode 1121a and the second anode 1122a but also save etching time and improve processing efficiency.

At step S23, as shown in FIGS. 12, 3, 4, and 5, first vias 118a are formed in part of the planarization layer PLN and the passivation layer PVX in the first sub-sub-pixel structure regions 101a, second vias 118b are formed in part of the planarization layer PLN and the passivation layer PVX near the second sub-sub-pixel structure regions 101b, the first vias 118a expose source electrodes 117a or drain electrodes 117b of the transistors T to be electrically connected with the first anodes 1121a, and the second vias 118b expose source electrodes 117a or drain electrodes 117b of the transistors T to be electrically connected with the second anodes 1121b.

In some embodiments, step S23 may alternatively be performed between steps S1 and S21.

In other embodiments, the first vias 118a may alternatively be formed in part of the planarization layer PLN and the passivation layer PVX near the first sub-sub-pixel structure regions 101a; or, the second vias 118b may alternatively be formed in the partition structures 113, the planarization layer PLN and the passivation layer PVX.

Afterwards, with reference to step S3 in FIG. 8, as shown in FIGS. 12 and 3, first sub-sub-pixel structures 1121 are formed in the first sub-sub-pixel structure regions 101a, second sub-sub-pixel structures 1122 are formed at a side of the partition structures 113 away from the substrate 10. The first sub-sub-pixel structures 1121 have the same luminous color as the second sub-sub-pixel structures 1122. The first sub-sub-pixel structure 1121 includes a first anode 1121a, and the second sub-sub-pixel structure 1122 includes a second anode 1122a The first anodes 1121a and the second anodes 1122a are formed in a same procedure. The second anodes 1122a are located at a side of the partition structures 113 away from the back plate 10, and the adjacent first anodes 1121a are partitioned by the partition structure 113. Orthographic projections of the first anodes 1121a on the back plate 10 and orthographic projections of the second anodes 1122a on the back plate 10 are mutually connected, or the orthographic projections of the first anodes 1121a on the back plate 10 and the orthographic projections of the second anodes 1122a on the back plate 10 overlap each other.

In this embodiment, step S3 may specifically include steps S31-S32.

At step S31, as shown in FIGS. 12 and 3, an anode material layer is deposited, the anode material layer is partitioned by the partition structures 113, the anode material layer on both sides of the partition structures 113 forms the first anodes 1121a, and the anode material layer on the partition structures 113 forms the second anodes 1122a.

The anode material layer may be deposited fully covering the structure below and the anode material layer in the non-pixel structure region 102 may be removed by dry etch. The anode material layer may be a laminate structure of a first transparent conductive layer, a metal silver layer and a second transparent conductive layer.

In this embodiment, the orthographic projections of the first anodes 1121a on the back plate 10 and the orthographic projections of the second anodes 1122a on the back plate 10 being mutually connected includes the case where extremely small gaps are present between the orthographic projections of the first anodes 1121a on the back plate 10 and the orthographic projections of the second anodes 1122a on the back plate 10 due to evaporation of the anode material layer and manufacturing process of the partition structures 113.

As shown in FIGS. 4 and 5, when the anode material layer is deposited, the first anodes 1121a fill the first vias 118a. When the anode material layer is deposited, lapping electrodes 119 are also formed, and the lapping electrodes 119 fill the second vias 118b and overlap with the second anodes 1122a.

When the first vias 118a are formed in the planarization layer PLN and the passivation layer PVX near the first sub-sub-pixel structure regions 101a, lapping electrodes 119 are also formed during deposition of the anode material layer, and the lapping electrodes 119 fill the first vias 118a and overlap with the first anodes 1121a. When the second vias 118b are formed in the partition structures 113, the planarization layer PLN and the passivation layer PVX, the second anodes 1122a fill the second vias 118b during deposition of the anode material layer.

At step S32, still referring to FIGS. 12, 3 and 4, a pixel definition layer PDL is formed on the first anodes 1121a, the second anodes 1122a and the non-pixel structure region 102 and openings are formed in the pixel definition layer PDL to expose the first anodes 1121a and the second anodes 1122a. A plurality of first light emitting blocks 1121c and one or more second light emitting blocks 1122c are correspondingly formed in each opening. A cathode material layer is evaporated. The cathode material layer on the first light emitting blocks 1121c forms first cathodes 1121b and the cathode material layer on the second light emitting blocks 1122c form second cathodes 1122b.

The pixel definition layer PDL is formed fully covering the structure below. One opening in the pixel definition layer PDL exposes all first anodes 1121a and all second anodes 1122a of one sub-pixel structure 112. The first light emitting blocks 1121c and the second light emitting blocks 1122c are OLED layers which may be formed by evaporation. The first light emitting blocks 1121c and the second light emitting blocks 1122c in a same sub-pixel structure 112 have same color. The cathode material layer is evaporated fully covering the structure below.

In a 3D display assembly 1, a cylindrical lens array 12 may be bonded to a side of the cathode planar electrode away from the substrate 110.

In some embodiments, the side of the cathode planar electrode away from the substrate 110 may be fully covered with an encapsulation layer. The encapsulation layer may be a thin film encapsulation layer, including an overlapping structure of several inorganic, organic and inorganic layers. The cylindrical lens array 12 is disposed at a side of the encapsulation layer away from the substrate 110.

Figure 13:
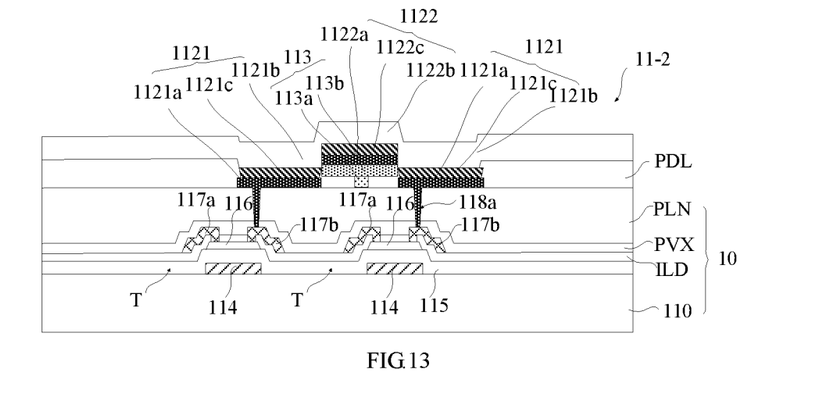
FIG. 13 is a schematic diagram illustrating a sectional structure of a display panel according to a second embodiment of the present disclosure.

FIG. 13 is a schematic diagram illustrating a sectional structure of a display panel according to a second embodiment of the present disclosure. With reference to FIG. 13, a 3D display assembly, a display panel 11-2 thereof and a manufacturing method of a display panel 11-2 in this embodiment may be substantially same as the 3D display assembly 1, the display panel 11-1 thereof and a manufacturing method of the display panel 11-1 in the first embodiment except for the following differences: in the display panel 11-2, in the first direction, i.e. a direction perpendicular to an extension direction of the cylindrical lens 121, the second anodes 1122a have the same width as the first anodes 1121a.

The second anodes 1122a have the same width as the first anodes 1121a such that the first sub-sub-pixel structures 1121 and the second sub-sub-pixel structures 1122 have same size, thereby improving 3D display effect and especially improving 3D display effect when the first sub-sub-pixel structures 1121 and the second sub-sub-pixel structures 1122 are separately driven to emit light.

Figure 14:
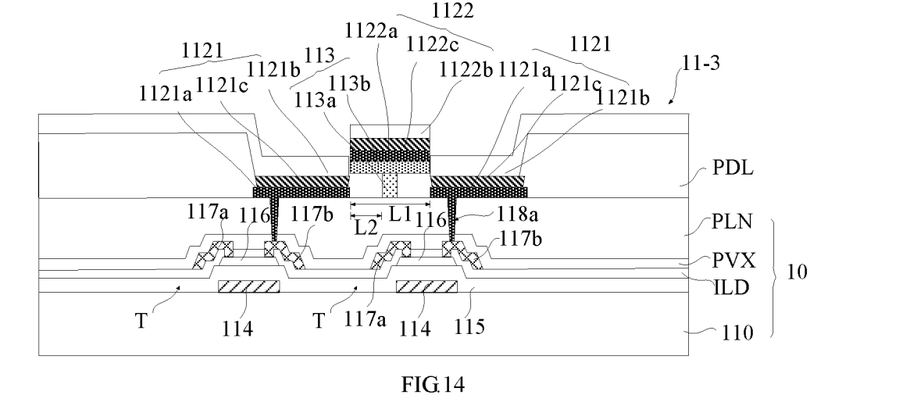
FIG. 14 is a schematic diagram illustrating a sectional structure of a display panel along a first direction according to a third embodiment of the present disclosure.
Figure 15:
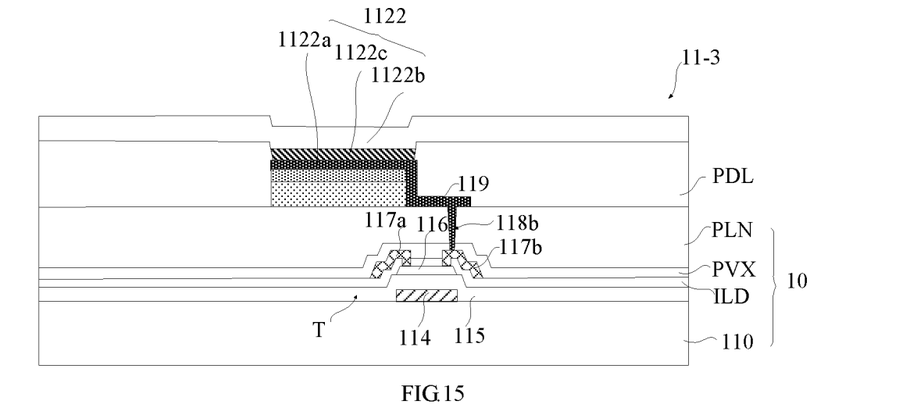
FIG. 15 is a schematic diagram illustrating a sectional structure of a display panel along a second direction according to a third embodiment of the present disclosure, where the second direction is perpendicular to the first direction.

FIG. 14 is a schematic diagram illustrating a sectional structure of a display panel along the first direction according to a third embodiment of the present disclosure. FIG. 15 is a schematic diagram illustrating a sectional structure of a display panel along a second direction according to the third embodiment of the present disclosure. The second direction is perpendicular to the first direction. As shown in FIGS. 14 and 15, a 3D display assembly, a display panel 11-3 thereof and a manufacturing method of a display panel 11-3 in this embodiment may be substantially same as the 3D display assemblies 1, the display panels 11-1, 11-2 thereof and manufacturing methods of the display panels 11-1, 11-2 in the first and second embodiments except for the following differences: as shown in FIG. 14, in the first direction, the first cathodes 1121b and the second cathodes 1122b are partitioned, and as shown in FIG. 15, in the second direction, the first cathodes 1121b and the second cathodes 1122b are connected together.

In the first direction, the partition of the first cathodes 1121b and the second cathodes 1122b may be resulted from a large thickness of the partition portions 113b and/or a large height of the support portions 113a and/or a small thickness of the cathode material layer.

In the second direction, the first cathodes 1121b and the second cathodes 1122b may be connected together by the cathode material layer in the non-pixel structure region 102.

Figure 16:
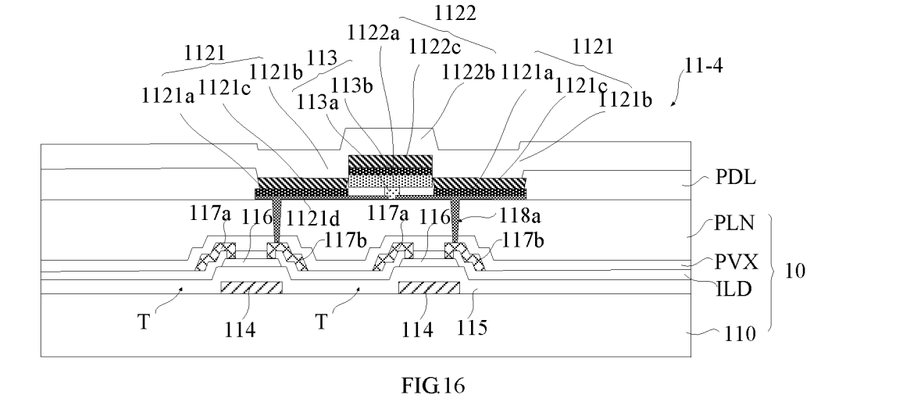
FIG. 16 is a schematic diagram illustrating a sectional structure of a display panel according to a fourth embodiment of the present disclosure.

FIG. 16 is a schematic diagram illustrating a sectional structure of a display panel according to a fourth embodiment of the present disclosure. As shown in FIG. 16, a 3D display assembly, a display panel 11-4 thereof and a manufacturing method of a display panel 11-4 in this embodiment may be substantially same as the 3D display assemblies 1, the display panels 11-1, 11-2 and 11-3 thereof and manufacturing methods of the display panels 11-1, 11-2 and 11-3 in the first, second and third embodiments except for the following differences: in the display panel 11-4, before the first material layer 1131 is formed in step S21, first transparent electrodes 1121d and second transparent electrodes (not shown) are formed on the planarization layer PLN, the first transparent electrodes are configured to be connected with respective first anodes 1121a, and the second transparent electrodes are configured to be connected with respective second anodes 1122a. The first transparent electrodes 1121d and the second transparent electrodes may serve as etch stop layers during etching of the second material layer 1132 and the first material layer 1131.

The second transparent electrodes may be located at the lapping electrodes 119.

As shown in FIG. 16, in this embodiment, orthographic projections of the first transparent electrodes 1121d on the substrate 110 are partially overlapped with orthographic projections of the partition structures 113 on the substrate 110 and specifically overlapped with the orthographic projections of the support portions 113a and the partition portions 113b. In other embodiments, the orthographic projections of the first transparent electrodes 1121d on the substrate 110 may alternatively be partially overlapped with the orthographic projections of the partition portions 113b on the substrate 110.

Materials of the first transparent electrodes 1121d and the second transparent electrodes may be Indium Tin Oxide (ITO). In this embodiment, the first transparent electrodes 1121d fill the first vias 118a, and the second transparent electrodes fill the second vias 118b. The first anodes 1121a and the second anodes 1122a may be a laminate structure of a metal silver layer and a second transparent conductive layer.

Figure 17:
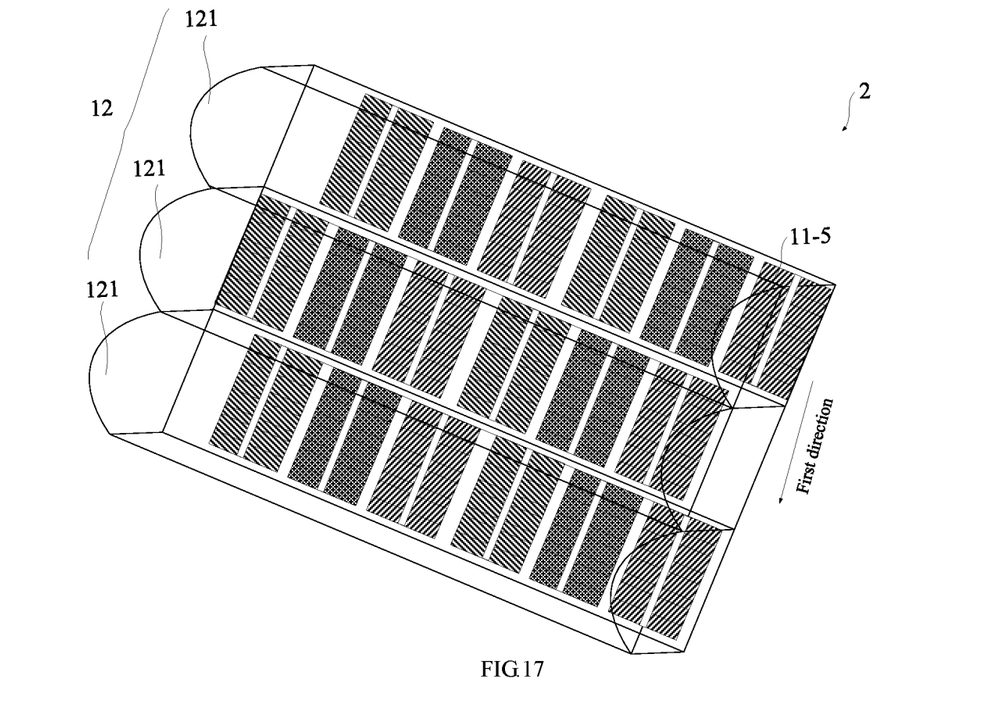
FIG. 17 is a perspective schematic diagram illustrating a 3D display assembly according to a fifth embodiment of the present disclosure.
Figure 18:
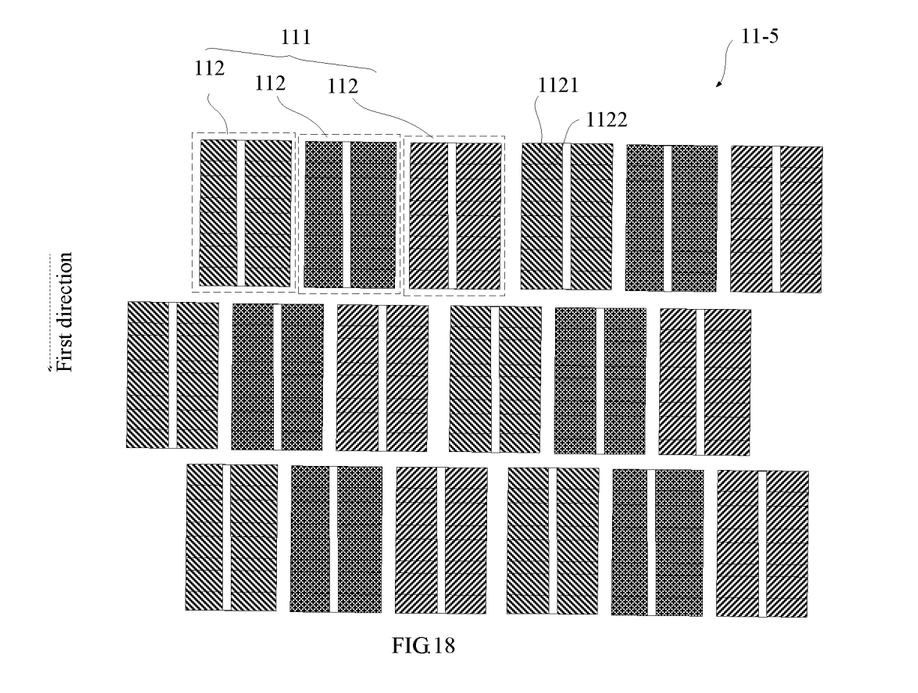
FIG. 18 is a top view of a display panel in FIG. 17.

FIG. 17 is a schematic diagram illustrating a perspective view of a 3D display assembly according to a fifth embodiment of the present disclosure. FIG. 18 is a top view of the display panel in FIG. 17. With reference of FIGS. 17 and 18, a 3D display assembly 2, a display panel 11-5 thereof and a manufacturing method of a display panel 11-5 in this embodiment may be substantially same as the 3D display assemblies 1, the display panels 11-1, 11-2, 11-3 and 11-4 thereof and manufacturing methods of the display panels 11-1, 11-2, 11-3 and 11-4 in the first to fourth embodiments except for the following differences: in the display panel 11-5, the first direction is a column direction, and the sub-pixel structure 112 includes two columns of first sub-sub-pixel structures 1121 and second sub-sub-pixel structures 1122 arranged alternately.

Specifically, the sub-pixel structure 112 includes two columns and at least two rows of alternately-arranged first sub-sub-pixel structures 1121 and two columns and at least one row of alternately arranged second sub-sub-pixel structures 1122. There is a gap between adjacent first sub-sub-pixel structures 1121 in a same row and there is also a gap between adjacent second sub-sub-pixel structures 1122 in a same row. The gaps may correspond to non-light emitting region. Even if a distance H between human eyes and the 3D display assembly 2 is very large, since the cylindrical lens 121 does not have magnification effect in the second direction (corresponding to the row direction in this embodiment), the human eyes cannot identify the above gaps in an observation region, that is, the above gaps will not form dark regions in the human eye observation region.

The first anodes 1121a of adjacent first sub-sub-pixel structures 1121 in a same row may be partitioned by etching, and the second anodes 1122a of adjacent second sub-sub-pixel structures 1122 in a same row may also be partitioned by etching.

Each first sub-sub-pixel structure 1121 in one sub-pixel structure 112 may carry different view information of one object. Therefore, compared with one column of first sub-sub-pixel structures 1121, two columns of first sub-sub-pixel structures 1121 can carry more view information of one object.

When the second sub-sub-pixel structures 1122 and the first sub-sub-pixel structures 1121 are independently driven to emit light, each first sub-sub-pixel structure 1121 and each second sub-sub-pixel structure 1122 in one sub-pixel structure 112 may carry different view information of one object. Therefore, compared with one column of first sub-sub-pixel structures 1121 and second sub-sub-pixel structures 1122, two columns of first sub-sub-pixel structures 1121 and second sub-sub-pixel structures 1122 can carry more view information of one object.

In other embodiments, in two columns of alternately-arranged first sub-sub-pixel structures 1121 and second sub-sub-pixel structures 1122, the first sub-sub-pixel structures 1121 and the second sub-sub-pixel structures 1122 may not be arranged in a row but staggered up and down.

In other embodiments, the first sub-sub-pixel structures 1121 and the second sub-sub-pixel structures 1122 in one sub-pixel structure 112 may alternatively be arranged in three or more columns.

A gap between adjacent first sub-sub-pixel structures 1121 in a same row in one sub-pixel structure 112 is smaller than a distance between the first sub-sub-pixel structures 1121 of different sub-pixel structures 112. A gap between adjacent second sub-sub-pixel structures 1122 in a same row in one sub-pixel structure 112 is smaller than a distance between the second sub-sub-pixel structures 1122 of different sub-pixel structures 112.

In other embodiments, the first direction is a row direction, and the sub-pixel structure 112 includes at least one row of alternately-arranged first sub-sub-pixel structures 1121 and second sub-sub-pixel structures 1122. Specifically, the sub-pixel structure 112 may include two or more rows of first sub-sub-pixel structures 1121 and second sub-sub-pixel structures 1122.

There is a gap between adjacent first sub-sub-pixel structures 1121 in a same column and there is also a gap between adjacent second sub-sub-pixel structures 1122 in a same column. The above gaps may correspond to non-light emitting region. Even if a distance H between human eyes and the 3D display assembly 2 is very large, since the cylindrical lens 121 does not have magnification effect in the second direction (corresponding to the column direction in this embodiment), the human eyes cannot identify the above gaps in an observation region, that is, the above gaps will not form dark regions in the human eye observation region.

The first anodes 1121a of adjacent first sub-sub-pixel structures 1121 in a same column may be partitioned by etching, and the second anodes 1122a of adjacent second sub-sub-pixel structures 1122 in a same column may also be partitioned by etching.

Each first sub-sub-pixel structure 1121 in one sub-pixel structure 112 may carry different view information of one object. Therefore, compared with one row of first sub-sub-pixel structures 1121, several rows of first sub-sub-pixel structures 1121 can carry more view information of one object.

When the second sub-sub-pixel structures 1122 and the first sub-sub-pixel structures 1121 are independently driven to emit light, each first sub-sub-pixel structure 1121 and each second sub-sub-pixel structure 1122 in one sub-pixel structure 112 may carry different view information of one object. Therefore, compared with one row of first sub-sub-pixel structures 1121 and second sub-sub-pixel structures 1122, several rows of first sub-sub-pixel structures 1121 and second sub-sub-pixel structures 1122 can carry more view information of one object.

In other embodiments, in two rows of alternately-arranged first sub-sub-pixel structures 1121 and second sub-sub-pixel structures 1122, the first sub-sub-pixel structures 1121 and the second sub-sub-pixel structures 1122 may not be arranged in a column but staggered left and right relative to each other.

It is noted that, in the drawings, the sizes of the layers and regions may be exaggerated for the purpose of clarity of illustrations. Furthermore, it may be understood that when an element or layer is referred as being on another element or layer, this element or layer may be directly on another element or there is an intermediate layer therebetween. In addition, it may be understood that when an element or layer is referred to as being below another element or layer, this element or layer may be directly below another element or there is one or more intermediate layers or elements therebetween. Furthermore, it may also be understood that when a layer or element is referred to as being between two layers or elements, it may be a unique layer between two layers or two elements, or there is one or more intermediate layers or elements. Similar reference numerals throughout the specification indicate similar elements.

In the present disclosure, the terms "first" and "second" are used for the purpose of descriptions only and shall not be understood as indicating or implying relative importance.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and embodiments are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display panel, comprising a back plate, and a plurality of sub-pixel structures and a plurality of partition structures located on the back plate,
wherein, in a first direction, each of the sub-pixel structures comprises one or more first sub-sub-pixel structures and one or more second sub-sub-pixel structures arranged alternately, the one or more first sub-sub-pixel structures have a same luminous color as the one or more second sub-sub-pixel structures, each of the first sub-sub-pixel structures comprises a first anode, each of the second sub-sub-pixel structures comprises a second anode, second anodes are disposed at a side of the partition structures away from the back plate, adjacent first anodes are partitioned by a partition structure, orthographic projections of the first anodes on the back plate and orthographic projections of the second anodes on the back plate are mutually connected, or the orthographic projections of the first anodes on the back plate and the orthographic projections of the second anodes on the back plate overlap each other.

2. The display panel of claim 1, wherein the partition structures are T-shaped, each of the T-shaped partition structures comprises a support portion and a partition portion, the second anodes are located at the side of the partition portions away from the back plate, and the first anodes are located at both sides of respective support portions.

3. The display panel of claim 2, wherein a height of each of the support portions is greater than a height of each of the first anodes; and/or,
the partition portions each comprises one or more suspended segments; in the first direction, a size of each of the partition portions is in a range of 40 μm-50 μm, and/or, a size of each of the suspended segments is in a range of 1 μm-2 μm.

4. The display panel of claim 1, wherein
the first direction is a column direction, and each of the sub-pixel structures comprises at least one column of first sub-sub-pixel structures and second sub-sub-pixel structures arranged alternately; or,
the first direction is a row direction, and each of the sub-pixel structures comprises at least one row of first sub-sub-pixel structures and second sub-sub-pixel structures arranged alternately.

5. The display panel of claim 4, wherein the first direction is the column direction, and each of the sub-pixel structures comprises at least two columns of first sub-sub-pixel structures and second sub-sub-pixel structures arranged alternately.

6. The display panel of claim 5, wherein each of the sub-pixel structures comprises at least two rows of first sub-sub-pixel structures and at least one row of second sub-sub-pixel structures that are alternately arranged and in at least two columns; there is a gap present between adjacent first sub-sub-pixel structures in a same row and between adjacent second sub-sub-pixel structures in a same row.

7. The display panel of claim 4, wherein the first direction is the row direction, and each of the sub-pixel structures comprises at least two rows of first sub-sub-pixel structures and second sub-sub-pixel structures arranged alternately.

8. The display panel of claim 7, wherein each of the sub-pixel structures comprises at least two columns of first sub-sub-pixel structures and at least one column of second sub-sub-pixel structures that are alternately arranged and in at least two rows; there is a gap present between adjacent first sub-sub-pixel structures in a same column and between adjacent second sub-sub-pixel structures in a same column.

9. The display panel of claim 1, wherein in the first direction, each of the second anodes has a same width as each of the first anodes.

10. The display panel of claim 1, wherein a second direction is perpendicular to the first direction; in the second direction, a length of each of the second anodes is in a range of 40 μm-50 μm, and in the first direction, a width of each of the second anodes is in a range of 10 μm-20 μm; and/or,
in the second direction, a length of each of the first anodes is in a range of 40 μm-50 μm, and in the first direction, a width of each of the first anodes is in a range of 10 μm-20 μm.

11. The display panel of claim 1, wherein in the first direction, each of the first anodes is connected with respective pixel driving circuits to provide different view information of one object;
one second anode and an adjacent first anode are connected with a same pixel driving circuit to provide same view information of one object; or, one second anode and an adjacent first anode are connected with different pixel driving circuits to provide different view information of one object.

12. The display panel of claim 1, wherein the back plate has a pixel definition layer having a plurality of openings and one of the sub-pixel structures is located in one of the openings.

13. The display panel of claim 1, wherein a distance between first sub-sub-pixel structures in a same sub-pixel structure is smaller than a distance between first sub-sub-pixel structures in different sub-pixel structures.

14. The display panel of claim 1, wherein each of the first sub-sub-pixel structures comprises a first cathode and each of the second sub-sub-pixel structures comprises a second cathode;
in the first direction, the first cathodes and the second cathodes are connected together; or, in the first direction, the first cathodes and the second cathodes are partitioned, and
in a second direction, the first cathodes and the second cathodes are connected together, and the second direction is perpendicular to the first direction.

15. A method of manufacturing a display panel, comprising:
providing a back plate, wherein the back plate comprises a plurality of sub-pixel structure regions arranged alternately and a non-pixel structure region; in a first direction, each of the sub-pixel structure regions comprises one or more first sub-sub-pixel structure regions and one or more second sub-sub-pixel structure regions arranged alternately;
forming one or more partition structures in the one or more second sub-sub-pixel structure regions;
forming one or more first sub-sub-pixel structures in the one or more first sub-sub-pixel structure regions, and forming one or more second sub-sub-pixel structures at a side of the partition structures away from the back plate, wherein the first sub-sub-pixel structures have a same luminous color as the second sub-sub-pixel structures, each of the first sub-sub-pixel structures comprises a first anode, and each of the second sub-sub-pixel structures comprises a second anode; first anodes and second anodes are formed in a same procedure, the second anodes are located at the side of the partition structures away from the back plate, adjacent first anodes are partitioned by a partition structure, orthographic projections of the first anodes on the back plate and orthographic projections of the second anodes on the back plate are mutually connected, or the orthographic projections of the first anodes on the back plate and the orthographic projections of the second anodes on the back plate overlap each other.

16. The method of claim 15, wherein forming the one or more first sub-sub-pixel structures on the first sub-sub-pixel structure regions and forming the one or more second sub-sub-pixel structures at the side of the partition structures away from the back plate comprise:
depositing an anode material layer, wherein the anode material layer is partitioned by the partition structures, the anode material layer at both sides of the partition structures forms the first anodes, and the anode material layer on the partition structures forms the second anodes;
forming a pixel definition layer on the first anodes, the second anodes and the non-pixel structure region; forming openings in the pixel definition layer, wherein the openings expose the first anodes and the second anodes; forming one or more first light-emitting blocks and one or more second light-emitting blocks correspondingly in each of the openings; evaporating a cathode material layer, wherein the cathode material layer on the first light-emitting blocks forms first cathodes and the cathode material layer on the second light-emitting blocks forms second cathodes.

17. The method of claim 16, wherein the back plate comprises a substrate and a planarization layer covering the substrate, pixel driving circuits arranged in an array are provided between the substrate and the planarization layer, and each of the pixel driving circuits comprises one or more transistors; before the anode material layer is deposited, a plurality of first vias and a plurality of second vias are formed in the planarization layer, the first vias expose source electrodes or drain electrodes of transistors to be connected with the first anodes, and the second vias expose source electrodes or drain electrodes of transistors to be connected with the second anodes; the first anodes fill the first vias when the anode material layer is deposited, lapping electrodes are also formed when the anode material layer is deposited, the lapping electrodes fill the second vias, and the lapping electrodes and the second anodes are overlapped.

18. The method of claim 15, wherein forming the one or more partition structures comprises:
forming a first material layer, a second material layer and a mask layer sequentially on the back plate across an entire surface; patterning the mask layer to form openings which expose the first sub-sub-pixel structure regions and the non-pixel structure region;
with the patterned mask layer as a mask, etching the second material layer and the first material layer, wherein an etching rate of the first material layer is greater than an etching rate of the second material layer, and the second material layer and the first material layer retained in the second sub-sub-pixel structure regions form the partition structures.

19. A 3D display assembly, comprising:
the display panel according to claim 1;
a cylindrical lens array disposed at a light-emitting side of the display panel, wherein the plurality of sub-pixel structures are located on a focal plane of the cylindrical lens array; the cylindrical lens array comprises a plurality of cylindrical lenses, and the cylindrical lenses extend in a direction perpendicular to the first direction.

20. The 3D display assembly of claim 19, wherein one group of sub-pixel structures having different luminous colors forms a pixel structure unit,
each cylindrical lens of the cylindrical lens array extends along a column direction, one cylindrical lens corresponds to one column of pixel structure units, and each of the sub-pixel structures comprises several columns of first sub-sub-pixel structures and several columns of second sub-sub-pixel structures; or,
each cylindrical lens of the cylindrical lens array extends along a row direction, one cylindrical lens corresponds to one row of pixel structure units, and each of the sub-pixel structures comprises several rows of first sub-sub-pixel structures and several rows of second sub-sub-pixel structures.

\* \* \* \* \*